United States Patent
Wang

(10) Patent No.: US 10,204,940 B2
(45) Date of Patent: Feb. 12, 2019

(54) ARRAY SUBSTRATE, ITS MANUFACTURING METHOD THEREOF AND A LIQUID CRYSTAL DISPLAY PANEL

(71) Applicant: Wuhan China Star Optoelectronics Technology Co., Ltd., Wuhan, Hubei (CN)

(72) Inventor: Wei Wang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 298 days.

(21) Appl. No.: 14/909,103

(22) PCT Filed: Dec. 30, 2015

(86) PCT No.: PCT/CN2015/099737
§ 371 (c)(1),
(2) Date: Jan. 30, 2016

(87) PCT Pub. No.: WO2017/107238
PCT Pub. Date: Jun. 29, 2017

(65) Prior Publication Data
US 2017/0323903 A1 Nov. 9, 2017

(30) Foreign Application Priority Data
Dec. 21, 2015 (CN) .......................... 2015 1 0966736

(51) Int. Cl.
*H01L 27/12* (2006.01)
*G02F 1/1368* (2006.01)
(Continued)

(52) U.S. Cl.
CPC .......... *H01L 27/127* (2013.01); *G02F 1/1368* (2013.01); *G02F 1/13439* (2013.01);
(Continued)

(58) Field of Classification Search
CPC . G02F 1/1368; H01L 27/127; H01L 27/1225; H01L 29/78693; H01L 29/517;
(Continued)

(56) References Cited

U.S. PATENT DOCUMENTS 6,635,559 B2 * 10/2003 Greenwald ....... H01L 21/28158
257/E21.192
8,841,710 B2 * 9/2014 Yamazaki ......... H01L 29/66742
257/288

(Continued)

*Primary Examiner* — Angela K Davison
(74) *Attorney, Agent, or Firm* — Andrew C. Cheng

(57) ABSTRACT

A manufacturing method of an array substrate is provided in this invention, a protective layer for the channel is formed by magnetron sputtering and thermal annealing treatment with the oxygen concentration greater than 21%, at a temperature of 300~400° C. and the material of the protection layer includes $Al_2O_3$. The present invention further includes an array substrate and a liquid crystal display panel with the array substrate. The present invention prevents the impurity such as hydrogen atom into the channel, and the quality of the protective layer prepared by the present invention is higher to ensure the electrical properties of the channel and process easy to be achieve and conducive to industrialization.

5 Claims, 3 Drawing Sheets

(51) Int. Cl.
   *G02F 1/1335*   (2006.01)
   *G02F 1/1343*   (2006.01)
   *H01L 29/786*   (2006.01)
   *H01L 29/66*    (2006.01)

(52) U.S. Cl.
   CPC .. *G02F 1/133514* (2013.01); *G02F 1/133516* (2013.01); *G02F 1/134309* (2013.01); *H01L 27/1225* (2013.01); *H01L 29/66969* (2013.01); *H01L 29/78606* (2013.01); *H01L 29/78693* (2013.01); *G02F 2201/50* (2013.01); *G02F 2202/10* (2013.01)

(58) Field of Classification Search
   CPC ......... H01L 29/78696; H01L 29/78678; H01L 29/78672; C23C 14/35; C23C 14/081; C23C 14/0617
   USPC .......................................................... 349/43
   See application file for complete search history.

(56) References Cited

U.S. PATENT DOCUMENTS

2012/0248446 A1\* 10/2012 Liu .................. H01L 29/78618
                                                    257/59
2015/0311345 A1\* 10/2015 Zhao ................. H01L 29/7869
                                                    257/43
2017/0104102 A1\* 4/2017 Liu ...................... H01L 21/385

\* cited by examiner

ARRAY SUBSTRATE, ITS MANUFACTURING METHOD THEREOF AND A LIQUID CRYSTAL DISPLAY PANEL

FIELD OF THE INVENTION

The present invention relates to the field of liquid crystal display technology, and in particular to an array substrate, its manufacturing method thereof and a liquid crystal display panel with the array substrate.

BACKGROUND OF THE INVENTION

With the increasing of the size and the high definition of the Liquid Crystal Display, LCD the thin film transistor, TFT with a larger electron mobility has been emerging and show great market prospect. Currently, the Indium Gallium Zinc Oxide, IGZO has been adapted to form amorphous oxide semiconductor, AOS layer of the TFT, also known as IGZO semiconductor pattern layer or channel. Since IGZO is a material extremely sensitive to water and oxygen, the water molecules and oxygen molecules in the LCD working environment can easily affect its electrical properties, so in order to improve the electrical stability of the TFT channel, a protective layer is needed to form on the channel.

The conventional material of the protective layer is typically of silicon oxide $SiO_2$, silicon nitride $Si_3N_4$, and usually formed by plasma enhanced chemical vapor deposition (PECVD), atomic layer epitaxy (ALD and magnetron sputtering, etc. in the system. However, the chemical vapor deposition method is easy to incorporate impurity hydrogen atom into the channel, the channel will not only be damaged, but also affect the electrical properties of the channel; the quality of the protective layer prepared by magnetron sputtering is poor and the stability of the channel protection is poor; the process of the atomic layer epitaxy is complex, time-consuming, and therefore not conducive to industrialization.

SUMMARY OF THE INVENTION

Therefore, an array substrate, its manufacturing method thereof and a liquid crystal display panel is provided in this invention to prevent the impurity such as hydrogen atom into the channel, and the quality of the protective layer prepared by the present invention is higher to ensure the electrical properties of the channel and process easy to be achieve and conducive to industrialization.

A manufacturing method for an array substrate is provided in the embodiment of the present invention includes: forming a first metal layer, an insulation layer and a semiconductor pattern layer subsequently; forming a second metal layer on the insulation layer and the semiconductor pattern layer, wherein the region of the second metal layer is an Al layer that corresponding to the semiconductor pattern layer, and the Al layer is formed by magnetron sputtering process; performing a thermal annealing treatment with the oxygen concentration greater than 21%, at a temperature of 300~400° C., to make the Al layer have an oxidation reaction into a $Al_2O_3$ layer; etching the second metal layer with $Al_2O_3$ layer to obtain a protective layer having a predetermined size on the semiconductor pattern layer; and forming a third metal layer on the $Al_2O_3$ layer, the third metal layer is formed with a recess, and the recess exposed the corresponding $Al_2O_3$ layer.

Wherein the first metal layer is the gate electrode of the thin film transistor of the array substrate, the third metal layer is the source and drain electrode layer of the thin film transistor, and the source electrode and a drain electrode are located on both sides of the protective layer.

Wherein the manufacturing method further including forming a passivation layer on the exposed $Al_2O_3$ layer and the third metal layer.

Wherein the passivation layer is formed on the exposed $Al_2O_3$ layer and the third metal layer by the method of chemical vapor deposition, atomic layer epitaxy, coating, sputtering, evaporation and any combination thereof.

Wherein the material of the passivation layer and the second metal layer is different.

Wherein the material of the passivation layer and the second metal layer is the same.

An array substrate in the embodiment of the present invention including a base substrate; a first metal layer, an insulation layer and a semiconductor pattern layer subsequently formed; a protective layer formed on the semiconductor pattern layer, wherein the surface of the protective layer is an $Al_2O_3$ layer, wherein the $Al_2O_3$ layer is formed by a magnetron sputtering made Al layer, and into the $Al_2O_3$ layer by thermal annealing treatment with the oxygen concentration greater than 21%, at a temperature of 300~400° C.; and a third metal layer formed on the $Al_2O_3$ layer, the third metal layer is formed with a recess, and the recess exposed the corresponding $Al_2O_3$ layer.

Wherein the first metal layer is the gate electrode of the thin film transistor of the array substrate, the third metal layer is the source and drain electrode layer of the thin film transistor, and the source electrode and a drain electrode are located on both sides of the protective layer. A liquid crystal display panel in the embodiment of the present invention including an array substrate, a color filter substrate disposed opposite to the array substrate and a liquid crystal interposed between the array substrate and the color filter substrate wherein the array substrate including: a base substrate; a first metal layer, an insulation layer and a semiconductor pattern layer subsequently formed; a protective layer formed on the semiconductor pattern layer, wherein the surface of the protective layer is an $Al_2O_3$ layer, wherein the $Al_2O_3$ layer is formed by a magnetron sputtering made Al layer, and into the $Al_2O_3$ layer by thermal annealing treatment with the oxygen concentration greater than 21%, at a temperature of 300~400° C.; and a third metal layer formed on the $Al_2O_3$ layer, the third metal layer is formed with a recess, and the recess exposed the corresponding $Al_2O_3$ layer.

Wherein the first metal layer is the gate electrode of the thin film transistor of the array substrate, the third metal layer is the source and drain electrode layer of the thin film transistor, and the source electrode and a drain electrode are located on both sides of the protective layer. The magnetron sputtering is adapted for the array substrate, a manufacturing method thereof and the liquid crystal display panel of the embodiment of is presented in the invention. The thermal annealing process is performed in an oxygen concentration greater than 21% and a temperature of 300~400° C. to obtain a channel protective layer, and the material of the protective layer including $Al_2O_3$. Compared to the chemical vapor deposition method, it can avoid the impurity hydrogen atom incorporated in the channel, so as to avoid damage of the channel, to ensure the electrical properties of the channel; and the film quality of the $Al_2O_3$ protective layer by the oxidation reaction is higher and with higher density, can further ensure the electrical properties of the channel; in addition, magnetron sputtering process and the thermal annealing process is simple and favor industrialization.

BRIEF DESCRIPTION OF THE DRAWINGS

The following detailed descriptions accompanying drawings and the embodiment of the present invention make the aspect of the present invention and the other beneficial effect more obvious.

DETAILED DESCRIPTION OF THE PREFERRED EMBODIMENTS

The specific components or items are used in the specification and claims. Those skilled in the art can use other possible modifications and variations in the same components or items. The specification and claim will not distinguish the different terms to the items or components but by the functions. Following is the detail description illustrated by the figures and the embodiments.

Figure 1:
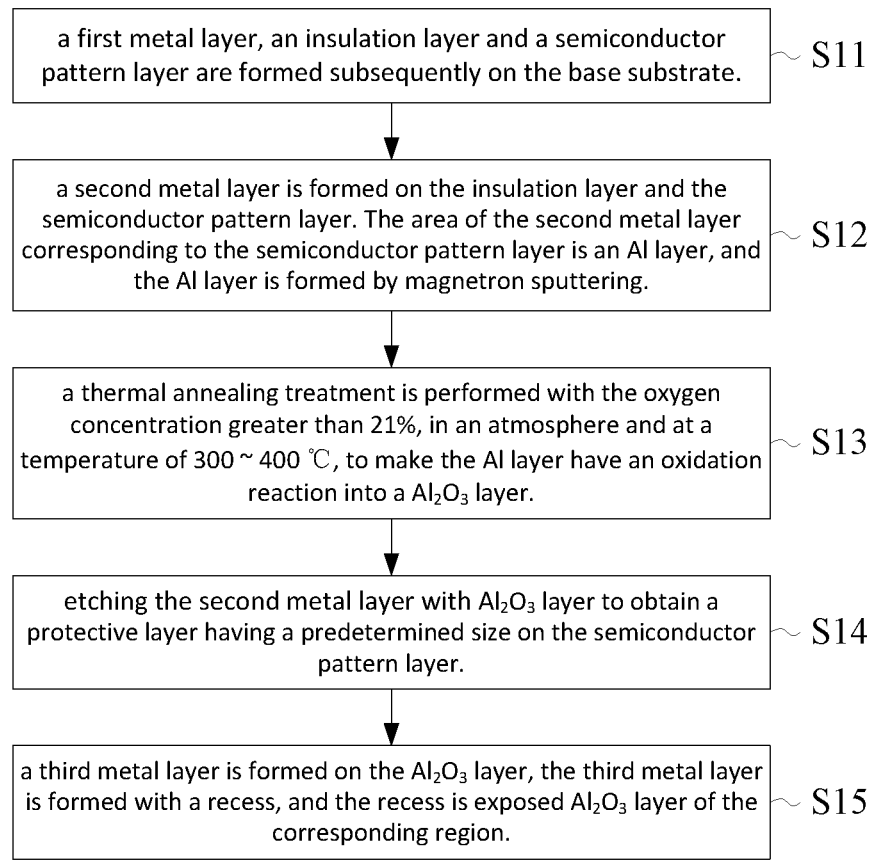
FIG. 1 illustrates the manufacturing process flow of the array substrate according to the first embodiment of the present invention.

FIG. 1 illustrates the manufacturing process flow of the array substrate according to the first embodiment of the present invention. The manufacturing method is used to form the protective layer on the IGZO channel of the TFT. The primary role of the protective layer is to prevent water molecules and oxygen molecules into the channel and contacts IGZO channel to ensure the electrical properties of the IGZO channel, and therefore the protective layer may also be referred to as an aqueous oxygen barrier layer or an etch stop layer, ESL. Referring to FIGS. 1-5, the manufacturing method steps includes:

S11: a first metal layer, an insulation layer and a semiconductor pattern layer are formed subsequently on the base substrate.

Figure 2:
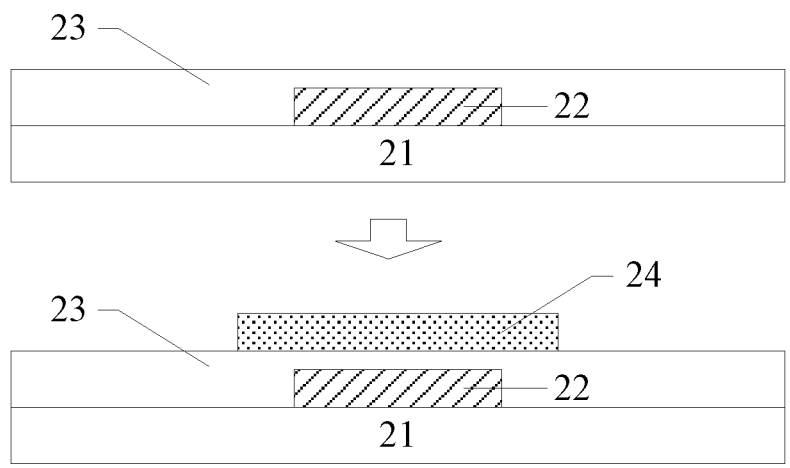
FIG. 2 illustrate the schematic diagram according to the manufacturing method of FIG. 1 of the first embodiment of the present invention.

Referring to FIG. 2, the base substrate 21 is used to form an array substrate. So the material of the base substrate 21 can be glass, transparent plastic material or a flexible substrate.

The first metal layer 22 can be formed on the base substrate 21 by sputtering, to form a gate electrode of the TFT with a predetermined pattern. Due to the source electrode and drain electrode of the TFT is subsequent formed, the insulation layer 23 is formed on a base substrate 21 such as Gate Insulation Layer, GI.

The semiconductor pattern layer 24 formed on the insulation layer 23 is an amorphous oxide semiconductor layer having a predetermined pattern. The material of the semiconductor pattern layer 24 includes, but not limited to IGZO, ITZO (InSnZnO). Embodiments of the present invention can be used includes, but not limited to, phosphoric acid, nitric acid, acetic acid and deionized water solution for etching the entire layer of the semiconductor pattern layer on the insulation layer 23, to thereby obtain a semiconductor pattern layer 24 having a predetermined pattern, of course, in other embodiments, dry etching may be used, but not limited thereto.

S12: a second metal layer is formed on the insulation layer and the semiconductor pattern layer.

The area of the second metal layer corresponding to the semiconductor pattern layer is an Al layer, and the Al layer is formed by magnetron sputtering.

Figure 3:
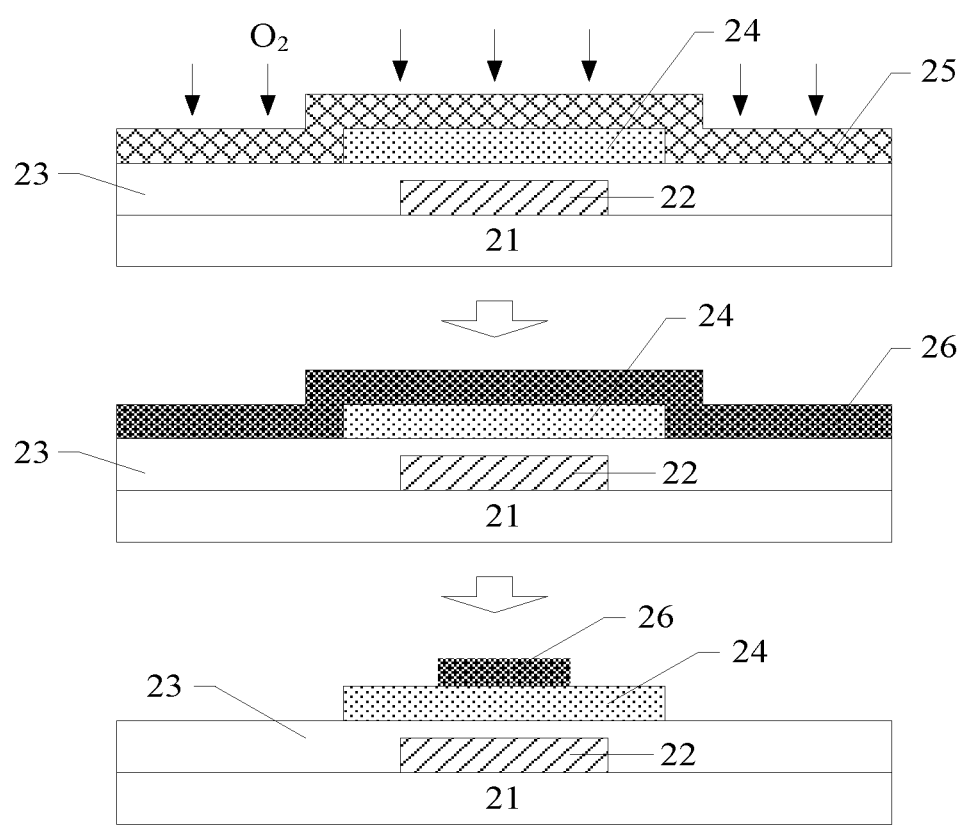
FIG. 3 illustrate the schematic diagram according to the manufacturing method of FIG. 1 of the first embodiment of the present invention.

As illustrated in FIG. 3, the second metal layer 25 is used to obtain the protective layer of the IGZO channel in this embodiment. In a preferred embodiment, the second metal layer 25 is formed by magnetron sputtering at a temperature of 300~400° C. to form the Al layer. Of course, in other embodiments, the second metal layer 25 may be provided only on the surface of the Al layer with a predetermined thickness, or only provide an Al layer corresponding on the surface of the semiconductor pattern layer 24 in a predetermined thickness, a base layer is formed below the Al layer using a predetermined manner, the material of the base layer in the present invention is not to be limited.

The impurity such as hydrogen atom and the like will not produce during forming the Al layer by magnetron sputtering process, so comparing to the chemical vapor deposition method or a Plasma Enhanced Chemical vapor deposition, PECVD, the embodiment of the present invention not only can reduce the damage of the IGZO channel, but can also avoid the incorporation of impurities, a hydrogen atom and the like into the semiconductor pattern layer 24, such as the IGZO channel, so as to ensure the electrical properties of the IGZO channel.

Besides, the magnetron sputtering process is simple and easy to achieve, and the efficiency is higher than the chemical vapor deposition methods and/or the plasma enhanced chemical vapor deposition, and is conducive to industrialization.

S13: a thermal annealing treatment is performed with the oxygen concentration greater than 21%, in an atmosphere and at a temperature of 300~400° C., to make the Al layer have an oxidation reaction into a $Al_2O_3$ layer.

Referring to FIG. 3, the Al atoms of the Al layer such as the second metal layer 25 have an oxidation reaction in the oxygen $O_2$ concentration greater than 21% of the oxygen-enriched atmosphere, it is possible to generate the greatest degree of $Al_2O_3$ layer 26, while 300 to 400° C. temperature can promote the oxidation reaction, to the greatest degree to assure the density of the $Al_2O_3$ layer 26 is formed, by the high film quality to further ensure the electrical properties of the channel IGZO.

In the embodiment of this invention, the three function of the thermal annealing treatment in an oxygen-rich atmosphere are as followed: First, to reduce the defect density of the IGZO active layer such as IGZO channel, by mainly reduce the oxygen vacancy concentration, to obtain a good electrical characteristics of the active layer. the second is to repair the damage of the second metal layer 25 during deposition and patterning process, magnetron sputtering and etching process on the channel active layer. The third is to oxide the Al layer to $Al_2O_3$ layer 26 with higher quality, to form a channel protective layer.

S14: etching the second metal layer with $Al_2O_3$ layer to obtain a protective layer having a predetermined size on the semiconductor pattern layer.

Continuing referring to FIG. 3, the $Al_2O_3$ layer 26 is etched, an embodiment of the present invention may be employed include, but not limited to wet etching, dry etching, etc. The predetermined size is the size of the IGZO TFT channel, protective layer as shown as $Al_2O_3$ layer 26 with the predetermined size is a protective layer of the IGZO channel.

S15: a third metal layer is formed on the $Al_2O_3$ layer, the third metal layer is formed with a recess, and the recess is exposed $Al_2O_3$ layer of the corresponding region.

Figure 4:
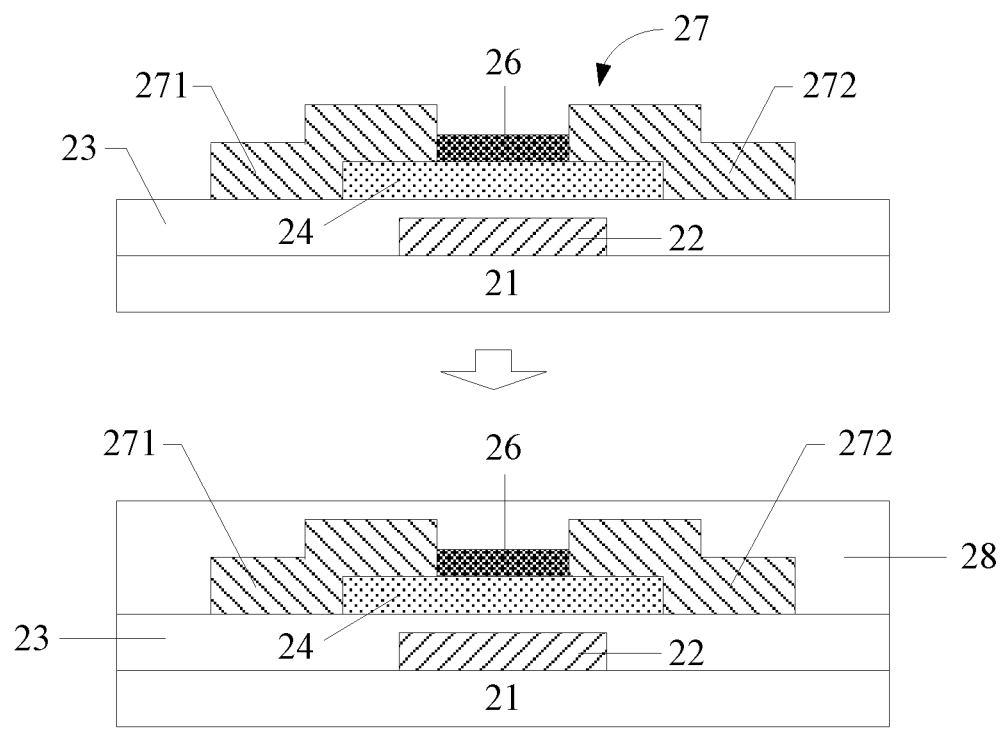
FIG. 4 illustrate the schematic diagram according to the manufacturing method of FIG. 1 of the first embodiment of the present invention.

Referring to FIG. 4, the third metal layer 27 is the source and drain electrode layer of the TFT, including a source electrode 271 and a drain electrode 272, the source electrode 271 and a drain electrode 272 are located on both sides of the protective layer.

Further, the manufacturing method of the present embodiment of the invention further including: forming a passivation layer 28 on the exposed $Al_2O_3$ layer, the $Al_2O_3$ layer 26 in a predetermined size and on the third metal layer 27. Wherein, the passivation layer 28 can be formed on the exposed $Al_2O_3$ layer and the third metal layer 27 by the method of chemical vapor deposition, atomic layer epitaxy, coating, sputtering, evaporation and any combination thereof. Further, the material of the passivation layer 28 and the second metal layer 25 can be the same or different.

Embodiments of the present invention also includes to provide an array structure shown in FIG. 4 by the manufacturing method mentioned above. The manufacturing method of the other structures on the array substrate can be found in the conventional technology.

Figure 5:
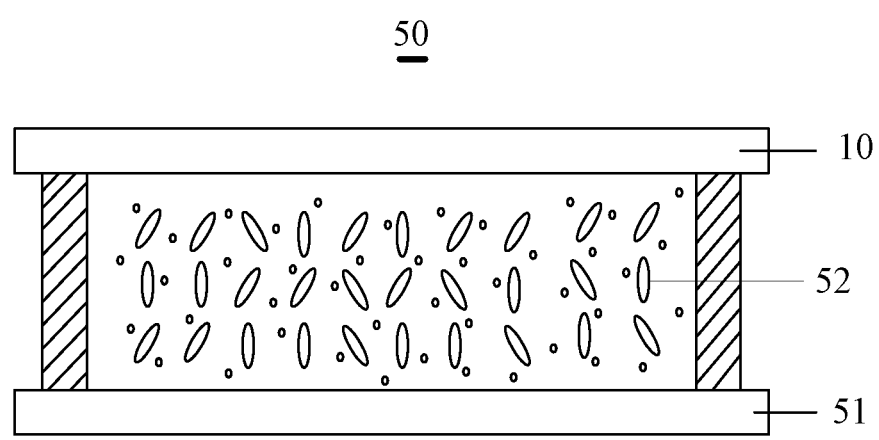
FIG. 5 is a cross-sectional view of the liquid crystal display apparatus in the preferred embodiment.

A liquid crystal display panel is also provided in the embodiments of the present invention, as shown in FIG. 5, the liquid crystal display panel 50 including the above array substrate 10, a color filter substrate 51 disposed opposite to the array substrate 10 and a liquid crystal 52 interposed between the array substrate 10 and the color filter substrate 51.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present invention has been explained above, it is not the limitation of the range, the sequence in practice, the material in practice, or the method in practice. Any modification or decoration for present invention is not detached from the spirit and the range of such.

What is claimed is:

1. A manufacturing method for an array substrate comprising: forming a first metal layer, an insulation layer and a semiconductor pattern layer subsequently; forming a second metal layer on the insulation layer and the semiconductor pattern layer, wherein a region of the second metal layer corresponding to the semiconductor pattern layer is an Al layer, and the Al layer is formed by a magnetron sputtering process; performing a thermal annealing treatment with an oxygen concentration greater than 21% at a temperature of 300~400° C., to make the Al layer have an oxidation reaction into an $Al_2O_3$ layer; etching the second metal layer having the $Al_2O_3$ layer to obtain a protective layer having a predetermined size on the semiconductor pattern layer; and forming a third metal layer on the $Al_2O_3$ layer, wherein the third metal layer is formed with a recess, and the recess exposes the corresponding $Al_2O_3$ layer.

2. The manufacturing method according to claim 1, wherein the first metal layer is a gate electrode of a thin film transistor of the array substrate, the third metal layer is a source and drain electrode layer of the thin film transistor, and a source electrode and a drain electrode are located on opposing sides of the protective layer.

3. The manufacturing method according to claim 1, further comprising forming a passivation layer on the exposed $Al_2O_3$ layer and the third metal layer.

4. The manufacturing method according to claim 3, wherein the passivation layer is formed on the exposed $Al_2O_3$ layer and the third metal layer by the method of chemical vapor deposition, atomic layer epitaxy, coating, sputtering, evaporation and any combination thereof.

5. The manufacturing method according to claim 4, wherein the material of the passivation layer and the second metal layer is different.

* * * * *